(12) United States Patent
Lu et al.

(10) Patent No.: US 11,042,086 B2
(45) Date of Patent: Jun. 22, 2021

(54) NANO-IMPRINTING METHOD AND NANO-IMPRINTING DEVICE

(71) Applicant: BOE TECHNOLOGY GROUP CO., LTD., Beijing (CN)

(72) Inventors: Yanhui Lu, Beijing (CN); Xin Gu, Beijing (CN); Kang Guo, Beijing (CN); Zhen Liu, Beijing (CN); Xiao Zhang, Beijing (CN); Wei Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 138 days.

(21) Appl. No.: 16/410,478

(22) Filed: May 13, 2019

(65) Prior Publication Data

US 2020/0089107 A1 Mar. 19, 2020

(30) Foreign Application Priority Data

Sep. 19, 2018 (CN) .......................... 201811093714.6

(51) Int. Cl.
*G03F 7/00* (2006.01)
(52) U.S. Cl.
CPC .................................. *G03F 7/0002* (2013.01)
(58) Field of Classification Search
CPC ..................................................... G03F 7/0002
See application file for complete search history.

(56) References Cited

U.S. PATENT DOCUMENTS

| 2015/0075855 | A1 | 3/2015 | Ito et al. |
| 2015/0210790 | A1* | 7/2015 | Ito ........................... B82Y 30/00 |
| | | | 216/13 |
| 2016/0144554 | A1* | 5/2016 | Yonezawa ............. B29C 59/005 |
| | | | 264/447 |
| 2016/0158998 | A1* | 6/2016 | Chiba ................... G03F 7/0002 |
| | | | 264/40.3 |

FOREIGN PATENT DOCUMENTS

| CN | 104246976 A | | 12/2014 |
| JP | 2004103817 A | | 4/2004 |
| JP | 2013254783 A | * | 12/2013 |

OTHER PUBLICATIONS

First Chinese Office Action dated Jan. 14, 2021, received for corresponding Chinese Application No. 201811093714.6, 16 pages.

* cited by examiner

*Primary Examiner* — Nathan H Empie
(74) *Attorney, Agent, or Firm* — Kinney & Lange, P.A.

(57) ABSTRACT

An embodiment of this disclosure provides a nano-imprinting method, including: applying an imprinting adhesive on a to-be-processed layer of a substrate located in an imprinting chamber; charging the imprinting chamber with a preset gas at a temperature higher than a boiling point of the preset gas, and pressing a nano-imprinting template on the imprinting adhesive; reducing an ambient temperature of the imprinting chamber to a temperature lower than the boiling point of the preset gas and maintaining the temperature for a preset time, such that the preset gas becomes a liquid; irradiating ultraviolet light from a side of the nano-imprint- (Continued)

ing template away from the imprinting adhesive to cure the imprinting adhesive; raising the ambient temperature of the imprinting chamber to be higher than the boiling point of the preset gas, such that the liquefied preset gas turns back into a gas; and demolding the nano-imprinting template from the imprinting adhesive.

5 Claims, 4 Drawing Sheets

NANO-IMPRINTING METHOD AND NANO-IMPRINTING DEVICE

CROSS-REFERENCE TO RELATED APPLICATION

This application claims priority to Chinese Patent Application No. 201811093714.6, filed on Sep. 19, 2018, the disclosures of which are incorporated in their entirety by reference herein.

BACKGROUND

The embodiments of the present disclosure relate generally to the field of display technology, and more particularly to a nano-imprinting method and a nano-imprinting device.

Nano-imprinting technology has the advantages of high resolution, simple process, low cost and high productivity, and thus is widely used in micro-nano manufacturing fields such as LED (light-emitting diode) and semiconductor.

UV nano-imprinting, in which the mold forming process can be completed by a simple UV exposure, is considered to be one of the most promising lithography technologies in the next generation. However, when a nano-imprinting is performed in air, air is usually trapped in the cavity of the mold, resulting in the formation of bubble defects, so that the imprinting adhesive cannot completely charge the cavity of the mold, resulting in imprinting defects and affecting the quality of the imprinting.

SUMMARY

An embodiment of the present disclosure provides a technical solution as follows.

In one aspect, a nano-imprinting method is provided, including: applying an imprinting adhesive on a to-be-processed layer of a substrate located in an imprinting chamber; charging the imprinting chamber with a preset gas at a temperature higher than a boiling point of the preset gas, and pressing a nano-imprinting template on the imprinting adhesive; reducing an ambient temperature of the imprinting chamber to a temperature lower than the boiling point of the preset gas and maintaining the temperature for a preset time, such that the preset gas becomes a liquid; irradiating the imprinting adhesive with ultraviolet light from a side of the nano-imprinting template away from the imprinting adhesive to cure the imprinting adhesive; and demolding the nano-imprinting template from the imprinting adhesive.

Further, after the imprinting adhesive has been cured and before demolding the nano-imprinting template from the imprinting adhesive, the method further includes: raising the ambient temperature of the imprinting chamber to be a temperature higher than the boiling point of the preset gas and maintaining the temperature for a preset time, such that the liquefied preset gas turns back into a gas.

Further, the preset gas has a boiling point of $-10°$ C. to $50°$ C.

Further, the preset gas has a boiling point of $9°$ C. to $40°$ C.

Further, the preset gas is selected from cyclobutane, neopentane, acetaldehyde, and diethyl ether.

Further, the preset time is 10 min to 30 min.

Further, the preset time is 15 min to 25 min.

An embodiment of the present disclosure further provides a nano-imprinting device, including: an imprinting chamber; a coating mechanism for applying an imprinting adhesive to a to-be-processed layer of a substrate a located in the imprinting chamber; a preset gas charging mechanism for charging a preset gas into the imprinting chamber; an ambient temperature control mechanism for controlling an ambient temperature in the imprinting chamber, to allow the ambient temperature to be higher than a boiling point of the preset gas, or be lower than the boiling point of the preset gas; an imprinting mechanism for pressing the nano-imprinting template on the imprinting adhesive and demolding the nano-imprinting template from the imprinting adhesive; and an ultraviolet light source for irradiating the imprinting adhesive with ultraviolet light, to cure the imprinting adhesive.

Further, the ambient temperature control mechanism is configured to control the ambient temperature of the imprinting chamber to be a temperature higher than the boiling point of the preset gas before pressing the nano-imprinting template on the imprinting adhesive, and to control the ambient temperature of the imprinting chamber to be a temperature lower than the boiling point of the preset gas and maintaining the temperature for a preset time after pressing the nano-imprinting template on the imprinting adhesive.

Further, the ambient temperature control mechanism is further configured to raise the ambient temperature of the imprinting chamber to a temperature higher than the boiling point of the preset gas and maintaining the temperature for a preset time after the imprinting adhesive has been cured and before demolding the nano-imprinting template from the imprinting adhesive, such that the liquefied preset gas turns back into a gas.

Further, the preset gas has a boiling point of $-10°$ C. to $50°$ C.

Further, the preset gas has a boiling point of $9°$ C. to $40°$ C.

Further, the preset gas is selected from cyclobutane, neopentane, acetaldehyde, and diethyl ether.

Further, the preset time is 10 min to 30 min.

Further, the preset time is 15 min to 25 min.

The present summary is provided only by way of example, and not limitation. Other aspects of the present disclosure will be appreciated in view of the entirety of the present disclosure, including the entire text, claims, and accompanying figures.

Figure 1:
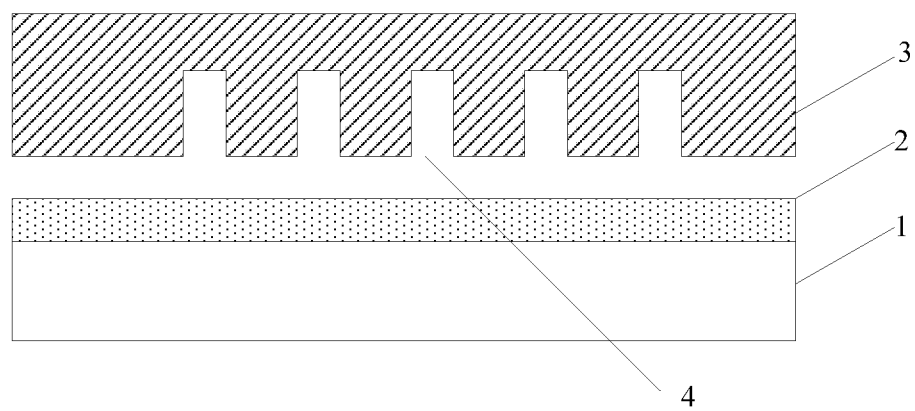
FIGS. 1 to 4 are schematic views showing a nano-imprinting of the related art.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

In order to make the technical problems to be solved, the technical solutions, and the advantages of the examples of the present disclosure, the present disclosure will be described hereinafter in conjunction with the drawings and specific examples.

Figure 2:
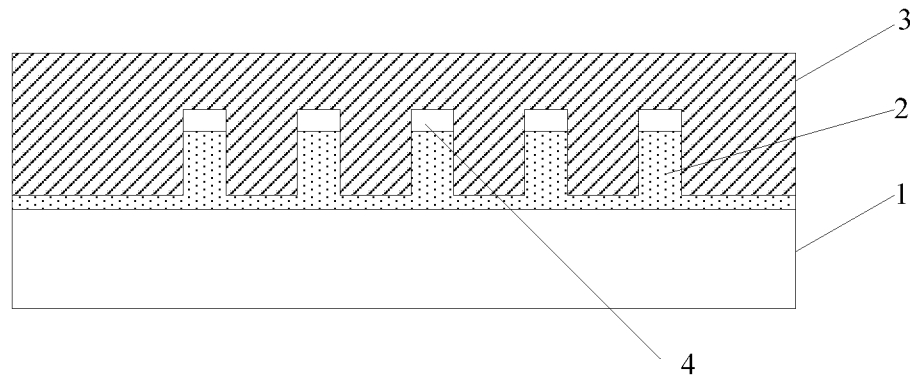
Figure 3:
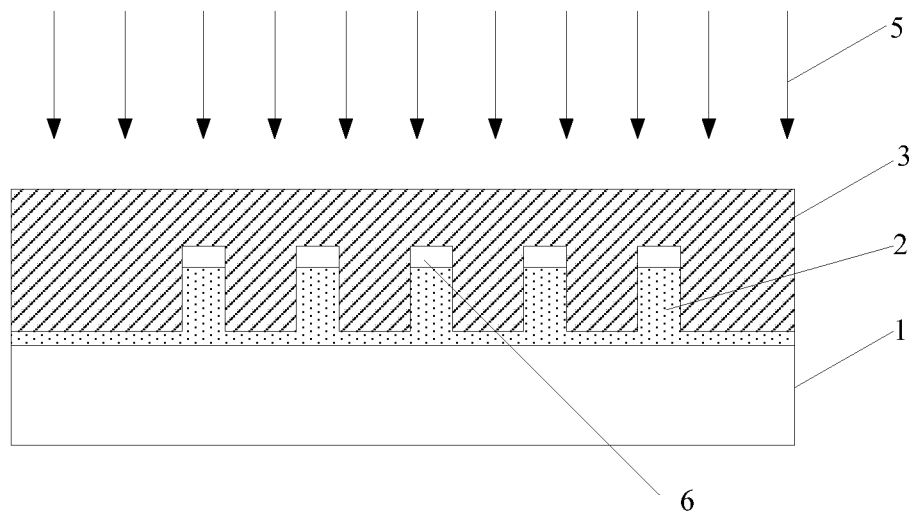
Figure 4:
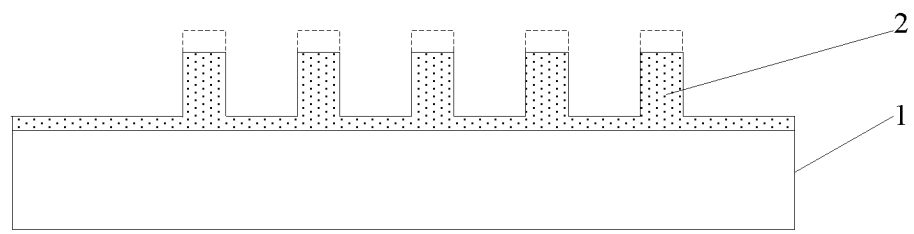

In the related art, when a nano-imprinting is performed, as shown in FIG. 1, an imprinting adhesive 2 is applied on a to-be-processed layer 1 of a substrate, and then, as shown in FIG. 2, the nano-imprinting template 3 is imprinted on the imprinting adhesive 2, so that the pattern of the nano-imprinting template 3 can be transferred to the imprinting adhesive 2, wherein the imprinting adhesive 2 is not completely removed to prevent the nano-imprint mold 3 from being in direct contact with the to-be-processed layer and damaging the nano-imprinting template 3. Then, as shown in FIG. 3, the imprinting adhesive 2 is cured by the ultraviolet light 5, and as shown in FIG. 4, after the imprinting adhesive 2 has been cured, the nano-imprinting template 3 is demolded from the imprinting adhesive 2. The imprinting adhesive 2 that is not completely removed is etched by an etchant to expose the surface of the to-be-processed layer. Then, after etching is completed by chemical etching, the imprinting adhesive 2 is demolded completely, to finally achieve a pattern of the to-be-processed layer with a high precision.

However, as shown in FIGS. 1 to 4, the related art performs a nano-imprinting in air 4, and when a nano-imprinting is performed in air 4, air is usually trapped in the cavity of the mold, resulting in the formation of bubble defects; and the imprinting adhesive 2 cannot completely charge the cavity of the mold, resulting in imprinting defects and affecting the quality of the imprinting.

The embodiments of the present disclosure are directed to the above problems, and provide a nano-imprinting method and a nano-imprinting device capable of improving the quality of the nano-imprinting.

An embodiment of the present disclosure provides a nano-imprinting method, including: applying an imprinting adhesive on a to-be-processed layer of a substrate located in an imprinting chamber; charging the imprinting chamber with a preset gas at a temperature higher than a boiling point of the preset gas, and pressing a nano-imprinting template on the imprinting adhesive; reducing an ambient temperature of the imprinting chamber to a temperature lower than the boiling point of the preset gas and maintaining the temperature for a preset time, such that the preset gas becomes a liquid; irradiating the imprinting adhesive with ultraviolet light from a side of the nano-imprinting template away from the imprinting adhesive to cure the imprinting adhesive; and demolding the nano-imprinting template from the imprinting adhesive.

In this embodiment, before imprinting, a preset gas is charged into the imprinting chamber at a temperature higher than the boiling point of the preset gas to form a specific gas atmosphere, and the nano-imprinting template is pressed on the imprinting adhesive. After imprinting, the ambient temperature is reduced, and the ambient temperature of the imprinting chamber is reduced to a temperature lower than the boiling point of the preset gas and maintained for a preset time, such that the preset gas is liquefied. The reserved gas between the nano-imprinting template and the imprinting adhesive is cooled to be a liquid, and the volume is shrunk. The imprinting adhesive charges the mold cavity of the nano-imprinting template under the action of pressure and capillary force. Thus, it eliminates the defects caused by the gas, improves the quality of the nano-imprinting, makes the operation simple and feasible, and further solve the problem caused by incomplete charging due to bubbles in the UV nano-imprinting process.

Further, after the imprinting adhesive has been cured and before demolding the nano-imprinting template from the imprinting adhesive, the method further includes: raising the ambient temperature of the imprinting chamber to a temperature higher than the boiling point of the preset gas and maintaining the temperature for a preset time, such that the liquefied preset gas turns back into a gas.

Thus, a pre-demold force can be applied to the demolding process, thereby assisting in demolding the mold; and the reserved liquefied preset gas will vaporize and evaporate without affecting subsequent processes.

Optionally, the preset gas is a gas that is easily liquefied and does not react with the imprinting adhesive, so that the cooling can be conveniently performed, and the preset gas can be liquefied without reducing the ambient temperature to very low.

Specifically, the boiling point of the preset gas may be $-10°$ C. to $50°$ C., and further may be $9°$ C. to $40°$ C., for example, $15°$ C., $18°$ C., $22°$ C., $25°$ C., $30°$ C., $38°$ C., $45°$ C., and the like. For example, the preset gas may be a gas such as cyclobutane (boiling point $12.5°$ C.) or neopentane (boiling point $9.5°$ C.), and the nano-imprinting process can be performed at normal temperature, such that the temperature is reduced to a temperature lower than the boiling point to liquefy cyclobutane or neopentane after imprinting. The preset gas may also be acetaldehyde (boiling point $20.8°$ C.), diethyl ether (boiling point $35°$ C.), etc., and the ambient temperature is maintained to be higher than the boiling points of these substances before imprinting and then reduced to a temperature lower than $20°$ C. in the imprinting process, thereby eliminating the defects caused by bubbles.

Of course, the preset gas is not limited to the above gas, and the above gas is merely an example. The preset gas may also be other gas having a boiling point within the normal temperature range.

Further, the preset time may be 10 min to 30 min, that is, after nano-imprinting template is pressed on the imprinting adhesive, the ambient temperature of the imprinting chamber is reduced to a temperature lower than the boiling point of the preset gas and maintained for 10 min to 30 min, such that the preset gas can be liquefied completely. Optionally, the preset time may be 15 min to 25 min, for example, 18 min, 20 min, 22 min, and the like.

An embodiment of the present disclosure further provides a nano-imprinting device, including: an imprinting chamber; a coating mechanism for applying an imprinting adhesive to a to-be-processed layer of a substrate located in the imprinting chamber; a preset gas charging mechanism for charging a preset gas into the imprinting chamber; an ambient temperature control mechanism for controlling an ambient temperature in the imprinting chamber, to allow the ambient temperature to be higher than a boiling point of the preset gas, or be lower than the boiling point of the preset gas; an imprinting mechanism for pressing the nano-imprinting template on the imprinting adhesive and demolding the nano-imprinting template from the imprinting adhesive; and an ultraviolet light source for irradiating the imprinting adhesive with ultraviolet light, to cure the imprinting adhesive.

With the help of the nano-imprinting device of the embodiment, before imprinting, a preset gas may be charged into the imprinting chamber at a temperature higher than the boiling point of the preset gas to form a specific gas atmosphere, and the nano-imprinting template is pressed on the imprinting adhesive. After imprinting, the ambient temperature is reduced, and the ambient temperature of the imprinting chamber is reduced to a temperature lower than the boiling point of the preset gas and maintained for a preset time, such that the preset gas is liquefied. The reserved gas between the nano-imprinting template and the imprinting adhesive is cooled to be a liquid, and the volume is shrunk. The imprinting adhesive charges the mold cavity of the nano-imprinting template under the action of pressure and capillary force. Thus, it eliminates the defects caused by the gas, improves the quality of the nano-imprinting, makes the operation simple and feasible, and further solve the problem of defects caused by incomplete charging due to bubbles in the UV nano-imprinting process.

Further, the ambient temperature control mechanism is configured to control the ambient temperature of the imprinting chamber to be a temperature higher than the boiling point of the preset gas before pressing the nano-imprinting template on the imprinting adhesive, and to control the ambient temperature of the imprinting chamber to be a temperature lower than the boiling point of the preset gas for a preset time after the pressing the nano-imprinting template on the imprinting adhesive, such that the preset gas is liquefied completely.

Further, the preset time may be 10 min to 30 min, that is, after nano-imprinting template is pressed on the imprinting adhesive, the ambient temperature of the imprinting chamber is reduced to a temperature lower than the boiling point of the preset gas and maintained for 10 min to 30 min, such that the preset gas can be liquefied completely. Optionally, the preset time may be 15 min to 25 min, for example, 18 min, 20 min, 22 min, and the like.

Further, the ambient temperature control mechanism is further configured to raise the ambient temperature of the imprinting chamber to be a temperature higher than the boiling point of the preset gas and maintain the temperature for a preset time after the imprinting adhesive has been cured and before demolding the nano-imprinting template from the imprinting adhesive, such that the liquefied preset gas turns back into a gas.

Thus, a pre-demold force can applied to the demolding process, thereby assisting in demolding the mold; and the reserved liquefied preset gas will vaporize and evaporate without affecting subsequent processes.

Optionally, the preset gas is a gas that is easily liquefied and does not react with the imprinting adhesive, so that the cooling can be conveniently performed, and the preset gas can be liquefied without reducing the ambient temperature to very low.

Specifically, the boiling point of the preset gas may be −10° C. to 50° C., and further may be 9° C. to 40° C., for example, 15° C., 18° C., 22° C., 25° C., 30° C., 38° C., 45° C., and the like. For example, the preset gas may be a gas such as cyclobutane (boiling point 12.5° C.) or neopentane (boiling point 9.5° C.), and the nano-imprinting process can be performed at normal temperature, such that the temperature is reduced to a temperature lower than the boiling point to liquefy cyclobutane or neopentane after imprinting. The preset gas may also be acetaldehyde (boiling point 20.8° C.), diethyl ether (boiling point 35° C.), etc., and the ambient temperature is maintained to be higher than the boiling points of these substances before imprinting and then reduced to a temperature lower than 20° C. in the imprinting process, thereby eliminating the defects caused by bubbles.

Of course, the preset gas is not limited to the above gas, and the above gas is merely an example. The preset gas may also be other gas having a boiling point within the normal temperature range.

Figure 5:
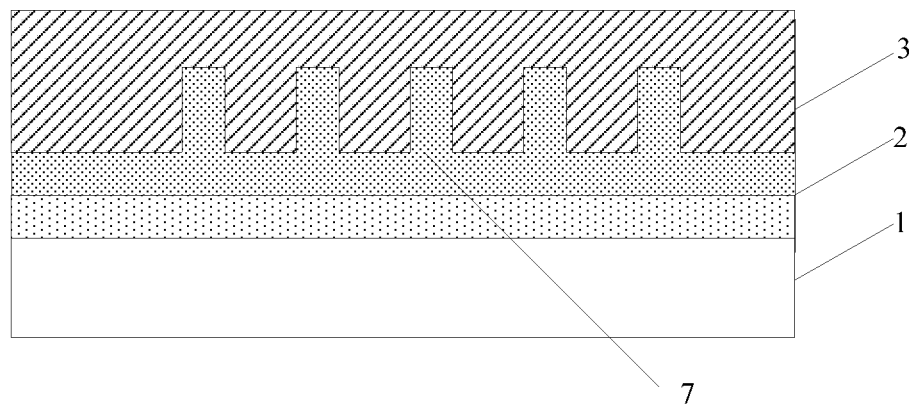
FIGS. 5 to 9 are schematic views of a nano-imprinting performed according to one embodiment of the present disclosure.

The technical solutions of the embodiments of the present disclosure will be further described below in conjunction with the accompanying drawings and specific embodiments, As shown in FIG. 5, in the atmosphere of the preset gas 7, an imprinting adhesive 2 is applied on a to-be-processed layer 1 of the substrate, and a nano-imprinting template 3 is provided.

Before nano-imprinting and during nano-imprinting, the ambient temperature is controlled to be a temperature higher than the boiling point of the preset gas 7.

Figure 6:
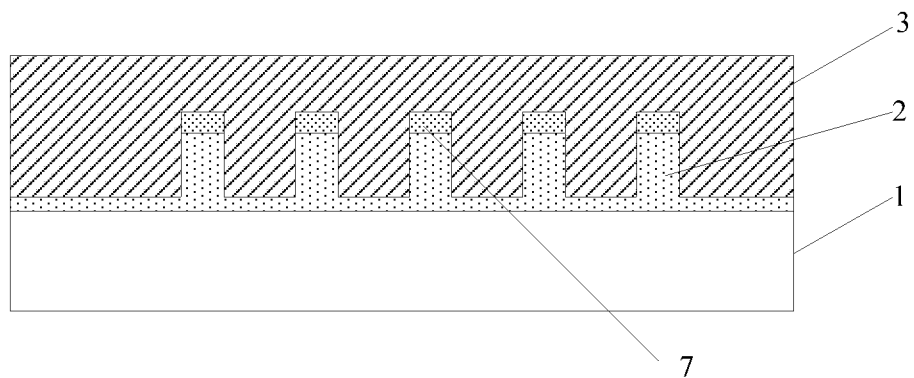

As shown in FIG. 6, the nano-imprinting template 3 is pressed on the imprinting adhesive 2, so that the pattern of the nano-imprinting template 3 can be transferred to the imprinting adhesive 2, in which the imprinting adhesive 2 is not completely removed to prevent the nano-imprint mold 3 from being in direct contact with the to-be-processed layer 1 and damaging the nano-imprinting template 3.

Figure 7:
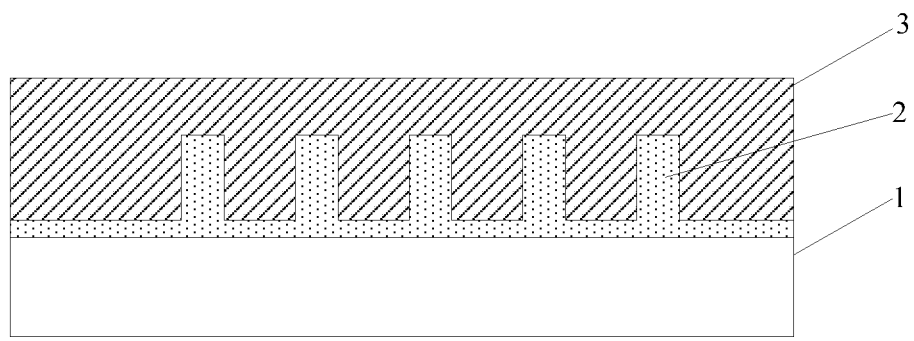

Before UV curing, the ambient temperature of the imprint is reduced to a temperature lower than the boiling point of the preset gas by blowing in a cold air or the like and maintained for a preset time. The gas trapped in the mold is cooled to be a liquid and the volume is shrunk, as shown in FIG. 7, the imprinting adhesive 2 charges the mold under the action of pressure and capillary force, thereby eliminating defects caused by gas.

Figure 8:
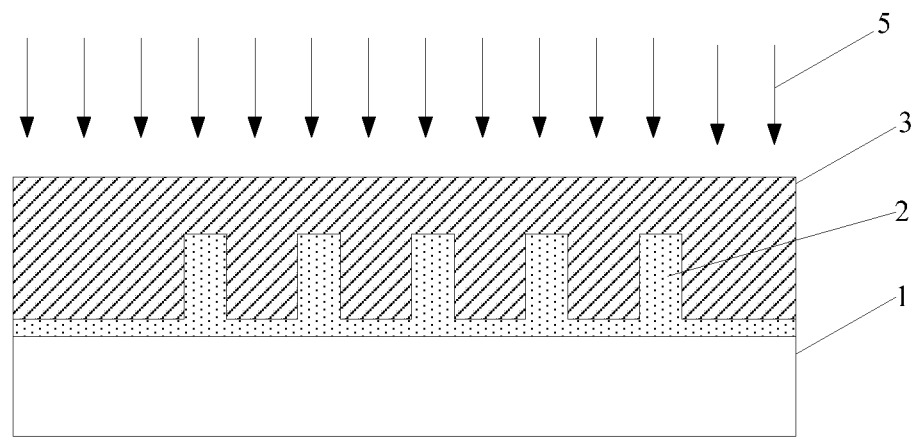

As shown in FIG. 8, ultraviolet light 5 is irradiated from a side of the nano-imprinting template 3 away from the imprinting adhesive 2 to cure the imprinting adhesive 2.

Figure 9:
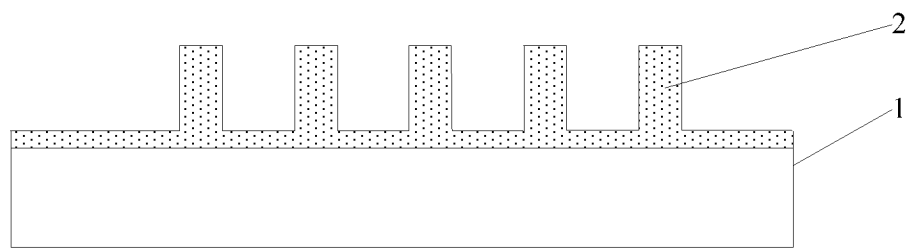

As shown in FIG. 9, after the imprinting adhesive 2 has been completely cured, the nano-imprinting template 3 is demolded from the imprinting adhesive 2. Thereafter, the to-be-processed layer 1 may be etched using the pattern of the imprinting adhesive as a mask, to form a pattern of the to-be-processed layer 1.

After the imprinting adhesive 2 has been cured and before demolding the nano-imprinting template 3 from the imprinting adhesive 2, the ambient temperature may be raised to a temperature higher than the boiling point of the preset gas, and the liquefied gas is evaporated at the ambient temperature, so that a pre-demold force can be applied to the demolding process, thereby assisting in demolding the mold; and the reserved liquefied preset gas will vaporize and evaporate without affecting subsequent processes.

This embodiment uses a gas that is easily liquefied (boiling point −10° C. to 50° C.). First, a gas is introduced into the gas atmosphere during the imprinting, and then the gas trapped in the cavity of mold is cooled to be a liquid by reducing the imprinting temperature. Under the action of the capillary force, the imprinting adhesive enters the cavity of the mold, thereby eliminating bubbles. Since the gas used has a low boiling point, the gas can be quickly liquefied by reducing the temperature, the volume occupied by the gas in the cavity can be reduced, and the imprinting adhesive sufficiently charges the cavity, thereby improving the quality of the imprinted pattern.

Unless otherwise defined, technical terms or scientific terms used herein have the normal meaning commonly understood by one skilled in the art in the field of embodiments of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after word, and does not exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above description are preferred embodiments of the present disclosure. It should be noted that one skilled in the art would make several improvements and substitutions without departing from the principles of the present disclosure. These improvements and modifications should also be regarded as the protection scope of the present disclosure.

The invention claimed is:

1. A nano-imprinting method, comprising:
   applying an imprinting adhesive on a to-be-processed layer of a substrate located in an imprinting chamber;
   charging the imprinting chamber with a preset gas at a temperature higher than a boiling point of the preset gas, and pressing a nano-imprinting template on the imprinting adhesive;
   reducing an ambient temperature of the imprinting chamber to a temperature lower than the boiling point of the preset gas and maintaining the temperature for a preset time, such that the preset gas becomes a liquid;
   irradiating the imprinting adhesive with ultraviolet light from a side of the nano-imprinting template away from the imprinting adhesive to cure the imprinting adhesive; and
   demolding the nano-imprinting template from the imprinting adhesive;
   wherein the preset gas is selected from the group consisting of cyclobutane, neopentane, acetaldehyde, and diethyl ether.

2. The nano-imprinting method of claim 1, wherein after the imprinting adhesive has been cured and before demolding the nano-imprinting template from the imprinting adhesive, the method further comprises:
   raising the ambient temperature of the imprinting chamber to a temperature higher than the boiling point of the preset gas and maintaining the temperature for a preset time, such that the liquefied preset gas turns back into a gas.

3. The nano-imprinting method of claim 1, wherein the preset time is 10 min to 30 min.

4. The nano-imprinting method of claim 3, wherein the preset time is 15 min to 25 min.

5. The nano-imprinting method of claim 1, wherein when the nano-imprinting template is pressed on the imprinting adhesive, the imprinting adhesive is not completely removed to prevent the nano-imprinting template from being in direct contact with the to-be-processed layer.

* * * * *